US010807207B2

(12) United States Patent
Lau

(10) Patent No.: US 10,807,207 B2
(45) Date of Patent: Oct. 20, 2020

(54) METHODS AND SUPPORTS FOR HOLDING SUBSTRATES

(71) Applicant: Applied Materials, Inc., Santa Clara, CA (US)

(72) Inventor: Simon Lau, Alzenau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 63 days.

(21) Appl. No.: 15/557,424

(22) PCT Filed: May 8, 2015

(86) PCT No.: PCT/EP2015/060235

§ 371 (c)(1),
(2) Date: Sep. 11, 2017

(87) PCT Pub. No.: WO2016/180449

PCT Pub. Date: Nov. 17, 2016

(65) Prior Publication Data

US 2018/0272484 A1 Sep. 27, 2018

(51) Int. Cl.
*B23Q 3/08* (2006.01)
*C03C 17/00* (2006.01)
(Continued)

(52) U.S. Cl.
CPC .......... *B23Q 3/084* (2013.01); *B65G 49/061* (2013.01); *B65G 49/064* (2013.01);
(Continued)

(58) Field of Classification Search
CPC ........ B23Q 3/084; B23Q 3/06; B65G 49/064; B65G 49/061; B65G 49/066; C23C 14/50;
(Continued)

(56) References Cited

U.S. PATENT DOCUMENTS

2009/0011232 A1* 1/2009 Dai ........................ B82Y 30/00 428/355 R
2012/0100464 A1* 4/2012 Kageyama ................ G03F 1/24 430/5
(Continued)

FOREIGN PATENT DOCUMENTS

CN 103068730 A 4/2013
CN 103814154 A 5/2014
(Continued)

OTHER PUBLICATIONS

WO 2013/044941 AI (Year: 2013).*
(Continued)

*Primary Examiner* — Lee D Wilson
*Assistant Examiner* — Thomas Raymond Rodgers
(74) *Attorney, Agent, or Firm* — Patterson & Sheridan, LLP

(57) ABSTRACT

A method and a support for holding a substrate, wherein the support is included in a transportation system configured to transport the substrate. The method includes attaching an adhesive to the support, wherein the material of the adhesive is a synthetic setae material and wherein the adhesive is configured to attach the substrate to the support; and attaching the adhesive to the substrate. Moreover, the thickness of the substrate is about 0.3 mm or less, and/or wherein the substrate has a size of 1.4 $m^2$ or more. The support includes a support body and an adhesive, wherein the material of the adhesive is a synthetic setae material and wherein the adhesive is configured to attach the support body to the substrate, wherein the support is included in a transportation system configured to transport the substrate.

21 Claims, 3 Drawing Sheets

(51) Int. Cl.
*C23C 14/50* (2006.01)
*B65G 49/06* (2006.01)
*C23C 16/458* (2006.01)

(52) U.S. Cl.
CPC .......... *B65G 49/066* (2013.01); *C03C 17/002* (2013.01); *C23C 14/50* (2013.01); *C23C 16/4583* (2013.01)

(58) Field of Classification Search
CPC ............ C23C 16/4583; C23C 16/4585; H01L 21/673; H01L 21/67303; H01L 21/67306; H01L 21/6732; H01L 21/67323; H01L 21/683; H01L 21/68757
USPC .............................................................. 269/7
See application file for complete search history.

(56) References Cited

U.S. PATENT DOCUMENTS

| | | | | |
|---|---|---|---|---|
| 2013/0244019 | A1* | 9/2013 | Hata | B82Y 30/00 428/312.2 |
| 2014/0368993 | A1* | 12/2014 | Sun | G06F 1/1656 361/679.55 |
| 2015/0107963 | A1 | 4/2015 | Hanisch et al. | |
| 2016/0159685 | A1* | 6/2016 | An | C03C 17/23 427/108 |

FOREIGN PATENT DOCUMENTS

| | | | | |
|---|---|---|---|---|
| EP | 1941969 | A1 | 7/2008 | |
| JP | 2006274301 | A | 10/2006 | |
| JP | 2007162063 | A | 6/2007 | |
| JP | 2009117441 | A | 5/2009 | |
| JP | 2012089837 | A | 5/2012 | |
| JP | 2014194896 | A | 10/2014 | |
| JP | 2014531759 | A | 11/2014 | |
| WO | 2013044941 | A1 | 4/2013 | |
| WO | WO-2013044941 | A1 * | 4/2013 | C23C 14/50 |
| WO | 2015012658 | A1 | 1/2015 | |

OTHER PUBLICATIONS

Bartlett, “Advanced Functional Material” (Year: 2012).*
Bartlett youtube in use disclosure; https://www.youtube.com/watch?v=9ZJYbcG0Ts0&feature=emb_logo (Year: 2012).*
Japanese Office Action dated Dec. 18, 2018 for Application No. 2017-558424 (APPM/22795JPP).
International Search Report and Written Opinion dated Jan. 18, 2016 for Application No. PCT/EP2015/060235.
Chinese Office Action dated May 15, 2019 for Application No. 201580078916.1 (APPM/22795CNP).

* cited by examiner 100
161
120
120
160
101a
101
120
120

100
121
121
160a
120
120
101a
160
101
161
151
151

METHODS AND SUPPORTS FOR HOLDING SUBSTRATES

TECHNICAL FIELD

Embodiments of the present invention relate to methods and supports for substrate processing, e.g., for layer deposition and apparatuses for carrying out the disclosed methods. Embodiments of the present invention particularly relate to methods and supports for supporting a large area substrate with a narrow thickness in a substrate processing machine and apparatuses for processing a large area substrate. Specifically, embodiments relate to methods for holding a substrate on a support, supports and substrates.

BACKGROUND

Several methods are known for depositing a material on a substrate. For instance, substrates may be coated by a physical vapor deposition (PVD) process, a chemical vapor deposition (CVD) process, a plasma enhanced chemical vapor deposition (PECVD) process etc. Typically, the process is performed in a process apparatus or process chamber, where the substrate to be coated is located. A deposition material is provided in the apparatus. A plurality of materials, also oxides, nitrides or carbides thereof may be used for deposition on a substrate. Further, other processing actions like etching, structuring, annealing, or the like can be conducted in processing chambers.

Coated materials may be used in several applications and in several technical fields. For instance, coated materials may be used in the field of microelectronics, such as for generating semiconductor devices. Also, substrates for displays are often coated by a PVD process. Further applications include insulating panels, organic light emitting diode (OLED) panels, substrates with TFT, color filters or the like.

Particularly for fields such as display production, manufacturing of thin-film solar cells and similar applications, large area glass substrates are processed. In the past, there has been a continuous increase in substrate sizes which is still to be continued. The increasing size of glass substrates makes the handling, supporting and processing thereof, without sacrificing the throughput by glass breakage, increasingly challenging.

Typically, glass substrates can be supported on carriers during processing thereof. A carrier drives the glass or the substrate through the processing machine. The carriers typically form a frame or a plate, which supports a surface of the substrate along the periphery thereof or, in the latter case, supports the surface as such. Particularly, a frame shaped carrier can also be used to mask a glass substrate, wherein the aperture in the carrier, which is surrounded by the frame, provides an aperture for coating material to be deposited on the exposed substrate portion or an aperture for other processing actions acting on the substrate portion, which is exposed by the aperture.

The tendency toward larger and also thinner substrates can result in bulging of the substrates due to stress applied to the substrate during a deposition process. Typically, support systems which hold a substrate during a deposition process introduce bulging on the substrate, e.g. due to forces that push the substrate edge towards the center of the substrate. Bulging can, in turn, cause problems due to the increasing likelihood of breakage. Accordingly, there is a need to reduce bulging and to enable a support included in a transportation system to transport bigger and thinner substrates without breakage, and to improve the quality of the coated material layers.

Moreover, typically, the space available for holding a substrate inside a deposition chamber is strictly limited. Accordingly, there is also a need to reduce the space employed by supporting systems for holding a substrate inside a deposition chamber.

In view of the above, it is beneficial to provide methods and supports for holding a substrate that overcome at least some of the problems in the art.

SUMMARY

In light of the above, a method for holding a substrate on a support, wherein the support is included in a transportation system configured to transport the substrate according to an independent claim is provided. According to another embodiment, a support according to another independent claim is provided. According to a further embodiment, a substrate comprising an adhesive according to a further independent claim is provided. Further aspects, advantages, and features are apparent from the dependent claims, the description, and the accompanying drawings.

According to one embodiment, a method for holding a substrate on a support, wherein the support is included in a transportation system configured to transport the substrate in a substrate processing chamber is provided. The method includes: attaching an adhesive to the support, wherein the material of the adhesive is a synthetic setae material and wherein the adhesive is configured to attach the substrate to the support, and attaching the adhesive to the substrate.

According to another aspect, a support included in a transportation system configured to transport the substrate is provided. The support includes a support body and an adhesive, wherein the material of the adhesive is a synthetic setae material and wherein the adhesive is configured to attach the support body to a substrate.

According to a further aspect, a substrate comprising an adhesive, wherein the material of the adhesive is a synthetic setae material and wherein the adhesive is configured to attach the substrate to a support included in a transportation system configured to transport the substrate is provided.

According to a further aspect, an apparatus for depositing a layer on a large area glass substrate is provided, including: a vacuum chamber adapted for layer deposition therein, a transportation system adapted for transportation of a support, wherein the support includes an adhesive configured to attach a substrate to the support, wherein the material of the adhesive is a synthetic setae material. The apparatus further includes a deposition source for depositing material forming the layer.

The disclosure is also directed to an apparatus for carrying out the disclosed methods and includes apparatus parts for performing each described method feature. These method features may be performed by way of hardware components, a computer programmed by appropriate software, by any combination of the two or in any other manner. Furthermore, the disclosure is also directed to methods for carrying out every operation of the described apparatus. It includes method features for carrying out every function of the apparatus.

BRIEF DESCRIPTION OF THE DRAWINGS

So that the manner in which the above recited features of embodiments of the present disclosure can be understood in detail, a more particular description, briefly summarized above, may be had by reference to embodiments. The accompanying drawings relate to embodiments of the present disclosure and are described in the following.

DETAILED DESCRIPTION OF EMBODIMENTS

Figure 1A:
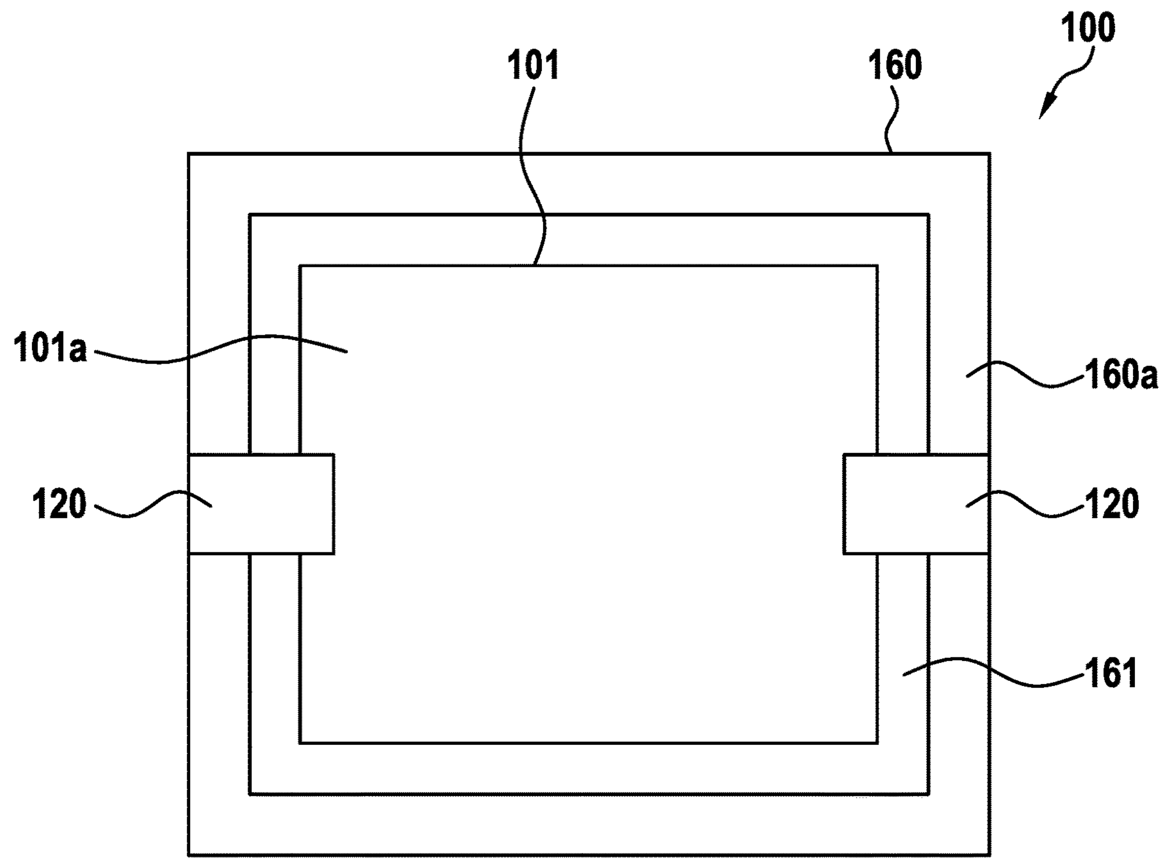
FIGS. 1A, 1B, 1C, 1D illustrate an example of a support for holding a substrate, wherein the support includes a carrier body according to embodiments described herein.

Reference will now be made in detail to the various embodiments of the present disclosure, one or more examples of which are illustrated in the figures. Within the following description of the drawings, the same reference numbers refer to same components. Generally, only the differences with respect to individual embodiments are described. Each example is provided by way of explanation of the present disclosure and is not meant as a limitation of the present disclosure. Further, features illustrated or described as part of one embodiment can be used on or in conjunction with other embodiments to yield yet a further embodiment. It is intended that the description includes such modifications and variations.

According to embodiments, described herein a method for holding a substrate on a support is provided. The method includes attaching an adhesive to the support, wherein the material of the adhesive is a synthetic setae material and wherein the adhesive is configured to attach the substrate to the support, and attaching the adhesive to the substrate. According to embodiments, the adhesive is attached to the substrate before the adhesive is attached to the support. According to other embodiments, which can be combined with other embodiments described herein, the adhesive is attached to the support before being attached to the substrate. Typically, the adhesive is configured to contact a first surface of the substrate, wherein said first surface is the backside surface of the substrate.

It is noted that the adhesive capabilities of the adhesive according to embodiments described herein are related to the adhesive properties of a gecko foot. The natural adhesive capability of the gecko foot allows the animal to adhere to surfaces of many types under most conditions. The adhesive capability of the gecko foot is provided by numerous hair-type extensions, called setae, on the feet of the gecko. It is noted here that the term “synthetic setae material” is to be understood as a synthetic material which emulates the natural adhesive capability of the gecko foot and which includes similar adhesive capabilities to the gecko foot. Moreover, the term “synthetic setae material” may be synonymously used with the term “synthetic gecko setae material” or with the term “gecko tape material”.

Typically the adhesive is inorganic. According to embodiments described herein the adhesive is substantially 100% inorganic. Moreover, the microstructure of the adhesive typically includes nanotubes. According to typical embodiments described herein, the microstructure of the adhesive includes carbon nanotubes. According to one embodiment, the storage elastic modulus G' of the adhesive is substantially constant up to a temperature of 600° C., particularly, wherein the storage elastic modulus is 80-120 Pa. According to typical embodiments, the storage elastic modulus G' of the adhesive is substantially constant up to 500° C., particularly, wherein the storage elastic modulus is approximately 105 Pa. According to embodiments, which can be combined with further embodiments described herein, the loss factor of the adhesive is substantially constant at a temperature of up to 600° C., particularly, wherein the loss factor is approximately 0.01-0.1. According to typical embodiments, which can be combined with further embodiments described herein, the loss factor of the adhesive is substantially constant up to a temperature of 500° C., particularly, wherein the loss factor is approximately 0.05. Furthermore, according to typical embodiments, the amount of outgassing of the adhesive measured using gas chromatography/mass spectroscopy under a temperature of 120° C. during 30 minutes is approximately 0.00051.

Moreover, according to typical embodiments, the adhesive is an adhesive tape. According to typical embodiments, a first surface of the adhesive includes the adhesive capabilities of the adhesive. According to other embodiments, more than one surface of the adhesive includes the adhesive capabilities of the adhesive.

Typically, the substrate may be made from any material suitable for material deposition. For instance, the substrate may be made from a material selected from the group consisting of glass (for instance soda-lime glass, borosilicate glass etc.), metal, polymer, ceramic, compound materials or any other material or combination of materials which can be coated by a deposition process. The bulging, which might also affect the processing of the substrate, can be reduced by the supports according to embodiments described herein. Particularly for glass substrates or ceramic substrates, where breakage is a further concern, the supports can also significantly reduce substrate breakage.

Typically, the support body can be made of aluminum, aluminum alloys, titanium, alloys thereof, stainless steel or the like. According to some embodiments, which can be combined with other embodiments described herein, the support body is a carrier body and can include two or more elements such as a top bar, sidebars and a bottom bar. According to other embodiments, the support body is typically a bar configured to hold the upper side of the substrate. Particularly, for very large area substrates, the carrier or carrier body can be manufactured having several portions. The support body is particularly configured for receiving the substrate in the substrate area.

Moreover, according to embodiments described herein, a support for holding a substrate for carrying out the disclosed method is provided. The support includes a support body and an adhesive, wherein the material of the adhesive is a synthetic setae material.

The adhesive included in the support according to embodiments described herein is configured to effectively reduce or even avoid bulging when holding a substrate, e.g. bulging due to forces that may push the substrate edge towards the center of the substrate.

Moreover, the adhesive included in the support according to embodiments described herein has a narrow thickness, typically a thickness of less than 1 mm, for example about 0.5 mm. The adhesive included in the support is then configured to effectively reduce the space needed for holding a substrate in a deposition chamber.

According to embodiments described herein, the adhesive included in the support is configured to contact a first surface of the substrate, wherein said first surface is the back side surface of the substrate. Hence, the support comprising the adhesive according to embodiments is configured to effectively improve the uniformity of a layer during a deposition process.

According to typical embodiments, which can be combined with other embodiments described herein, the substrate thickness can be from 0.1 to 1.8 mm and supports according to embodiments described herein can be adapted for such substrate thicknesses. Moreover, particularly beneficial is if the substrate thickness is 0.3 mm or below, such as 0.2 mm or below, for example 0.1 mm and the supports according to embodiments described herein are adapted for such substrate thicknesses.

According to some embodiments, large area substrates may have a size of at least 0.174 $m^2$. Typically the size can be about 1.4 $m^2$ to about 8 $m^2$, or about 2 $m^2$ to about 9 $m^2$ or even up to 12 $m^2$. Typically, the rectangular substrates, for which the apparatuses and methods according to embodiments described herein are provided, are large area substrates as described herein. For instance, a large area substrate can be GEN 5, which corresponds to about 1.4 $m^2$ substrates (1.1 m×1.3 m), GEN 7.5, which corresponds to about 4.39 $m^2$ substrates (1.95 m×2.25 m), GEN 8.5, which corresponds to about 5.5 $m^2$ substrates (2.2 m×2.5 m), or even GEN 10, which corresponds to about 8.7 $m^2$ substrates (2.85 m×3.05 m). Even larger generations such as GEN 11 and GEN 12 and corresponding substrate areas can similarly be implemented. Embodiments of the present disclosure are particularly beneficial with a substrate thickness of about 0.3 mm, about 0.2 mm or about 0.1 mm and a large area substrates GEN 6 to GEN 8.5.

According to some embodiments, which can be combined with other embodiments described herein, the supports described herein and the apparatuses for utilizing the supports described herein, are for vertical substrate processing. The term vertical substrate processing is understood to distinguish over horizontal substrate processing. That is, vertical substrate processing relates to an essentially vertical orientation of the substrate during substrate processing, and thus typically also the support, wherein a deviation of a few degrees, e.g. up to 10° or even up to 15°, from an exact vertical orientation is still considered as vertical substrate processing. A vertical substrate orientation with a small inclination can for example result in more stable substrate handling or a reduced risk of particles contaminating a deposited layer.

Figure 1B:
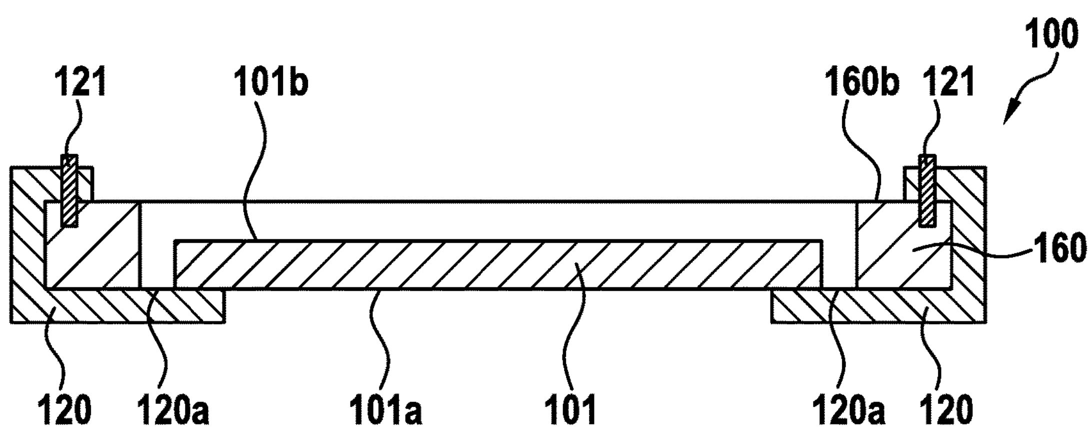

FIG. 1A shows a backside view of a substrate 101 attached to a support, wherein the support is a carrier 100. The carrier 100 is configured for supporting a large area substrate 101 with a narrow thickness. Moreover, FIG. 1B shows another schematic view of the carrier shown in FIG. 1A.

As shown in FIG. 1A, the substrate 101 is provided in a position within the carrier 100, particularly when processed in a processing chamber. The carrier 100 includes a frame or carrier body 160 defining a window or aperture 161. According to typical implementations, the frame provides a substrate receiving surface. Typically, the substrate receiving surface is configured to receive a perimeter portion of the substrate during operation, i.e. when the substrate is loaded.

For comparably small large area substrates, e.g. GEN 5 or below, the frame 160 can be manufactured from a single piece, i.e. the frame is integrally formed. According to some embodiments, which can be combined with other embodiments described herein, the frame 160 can include two or more elements such as a top bar, sidebars and a bottom bar. Particularly for very large area substrates, the carrier or carrier body can be manufactured having several portions. These portions of the carrier body are assembled to provide the frame 160 for supporting the substrate 101.

The carrier 100 shown in FIG. 1A further includes an adhesive 120, wherein the material of the adhesive is a synthetic setae material and wherein the adhesive is configured to attach the substrate 101 to the carrier body 160. According to typical embodiments, the adhesive 120 is an adhesive tape, as shown e.g. in FIG. 1A.

According to typical embodiments, a first surface of the adhesive 120 includes the adhesive capabilities of the adhesive 120. According to other embodiments, more than one surface of the adhesive 120 includes the adhesive capabilities of the adhesive 120.

According to typical embodiments, one surface of the adhesive 120, e.g. the upper surface, is configured to attach the substrate 101 to the support body, e.g. the carrier body 160. According to other embodiments, two surfaces of the adhesive 120, e.g. the upper surface and lower surface, are configured to attach the substrate 101 to the support body, e.g. carrier body 160.

Typically, the carrier 100 may further include one or more attaching elements 121 configured to attach an adhesive 120 portion to the carrier body 160. According to typical embodiments, the attaching elements 121 can be screws, rivets, clamps, or other elements to attach the adhesive 120 to the carrier body 160.

According to embodiments described herein, the attaching elements 121 are configured to attach the adhesive 120 to the upper surface of the carrier body 160*b*, as shown e.g. in FIG. 1B. According to other embodiments, the attaching elements 121 are configured to attach the adhesive 120 to the backside surface of the carrier body 160*a*.

The adhesive 120 included in the carrier 100 provides an attachment of the substrate 101 to the carrier body 160 which reduces or even avoids forces that push the substrate edge towards the substrate center. Hence, bulging of the substrate is also reduced. Moreover, the adhesive 120 provides holding or supporting forces for supporting the substrate stably.

Moreover, the adhesive included in the carrier 100 has a narrow thickness, typically a thickness of less than 1 mm, for example about 0.5 mm. The adhesive 120 included in the carrier 100 allows for providing a supporting system which reduces the space needed for supporting the substrate 101 in a deposition chamber.

In the example shown in FIG. 1A two adhesive portions 120 are provided in a first side and a second side of the frame 160. According to some embodiments, one adhesive 120 portion is provided at the middle left side of the frame or carrier body 160 and one adhesive 120 portion is provided at the middle right side of the frame or carrier body 160.

According to some embodiments, the two adhesive portions 120 could also be provided at the middle of the upper and lower sides of the carrier body. Moreover, a position of the substrate 101 within the substrate area defined by the frame 160 can be adjusted and fixed.

According to some embodiments, the adhesive or adhesive portions 120 are configured to contact a first surface of the substrate, wherein said first surface is the backside surface of the substrate 101*a*, as shown e.g. in FIG. 1B. A contact between the upper surface or deposition surface of the substrate 101*b* and the carrier 100 is reduced or even avoided. Hence, uniformity of a layer during a deposition process can be improved. Moreover, according to typical embodiments, a first surface of the adhesive 120*a* is configured to attach the substrate 101 to the carrier body 160, as shown e.g. in FIG. 1B.

Although two adhesive portions 120 at the left side and right side of the frame 160 are shown in FIG. 1A, the present disclosure is not limited thereto. One adhesive 120 portion could also be provided at one side of the frame, e.g. the upper side of the frame. Moreover, more than two adhesive portions 120 could be provided at the left side of the frame 160 and/or more than two adhesive portions 120 could be provided at the right side of the frame. Further, more than one adhesive 120 portion could be provided on one or more sides of frame 160, as described in more details with respect to FIG. 1C.

The adhesive included in a support according to embodiments herein provides an attachment of a substrate to a support body which reduces or even avoids forces that push the substrate edge towards the center of the substrate. Hence, bulging of the substrate can also be reduced. Additionally, the support including an adhesive according to embodiments described herein can provide holding or supporting forces for supporting the substrate stably.

Moreover, the adhesive included in a support according to embodiments described herein allows for providing a supporting system which reduces the space needed for supporting a substrate.

Further, a support according to embodiments described herein provides the adhesive configured to contact a first surface of the substrate, wherein said first surface is the backside surface of the substrate. A contact with the upper surface or deposition surface of the substrate can be reduced or avoided. Hence, the uniformity of a layer during a deposition process can be improved.

Figure 1C:
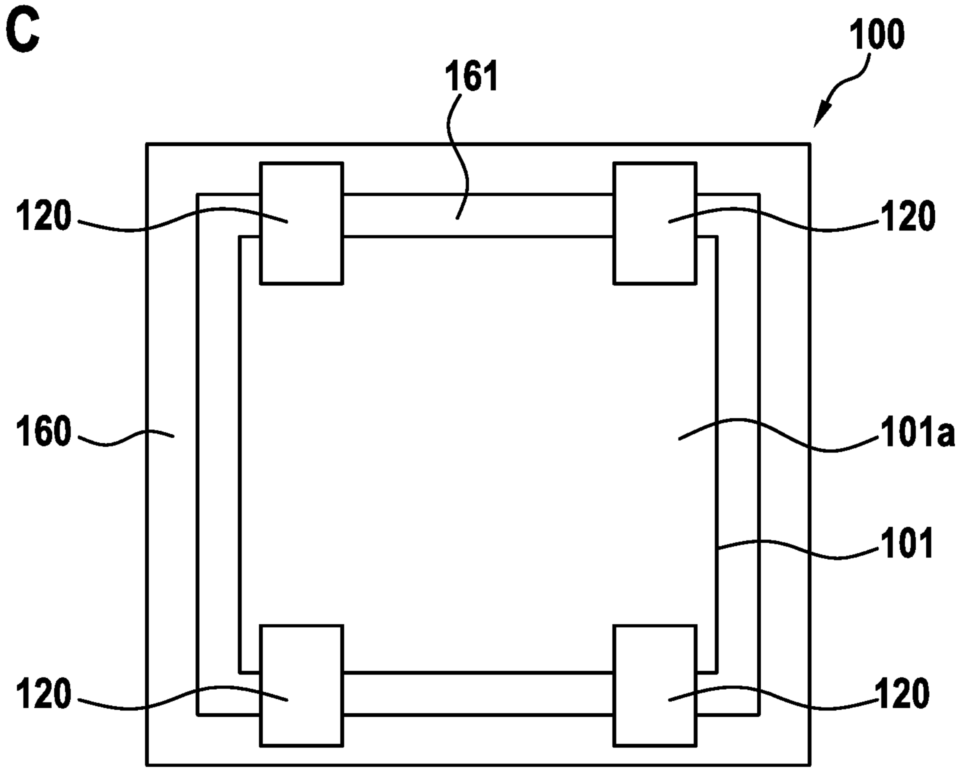

FIG. 1C shows another example of a substrate 101 attached to a carrier 100 according to some embodiments. The embodiment shown in FIG. 1C is similar to the embodiment shown in FIG. 1A. The carrier 100 of FIG. 1C includes four adhesive portions 120, wherein each adhesive portion is positioned at each corner of the carrier body. According to some embodiments, four adhesive portions could also be provided at the middle of each side of the carrier or carrier body.

According to further embodiments, which can additionally or alternatively be implemented, the positions at which the adhesive portions are fixed to the substrate are distributed, for example uniformly distributed, around the perimeter of the substrate. For example, an adhesive portion can be provided every 300 mm to every 1000 mm, such as every 300 to 800 mm around the edge of the substrate. Typically, the adhesive portions can also be provided in pairs of positions. For example, bending of a GEN 8.5 substrate might be reduced by including adhesive portions at from 6 to 24 positions or from 3 to 12 pairs of positions respectively.

Figure 1D:
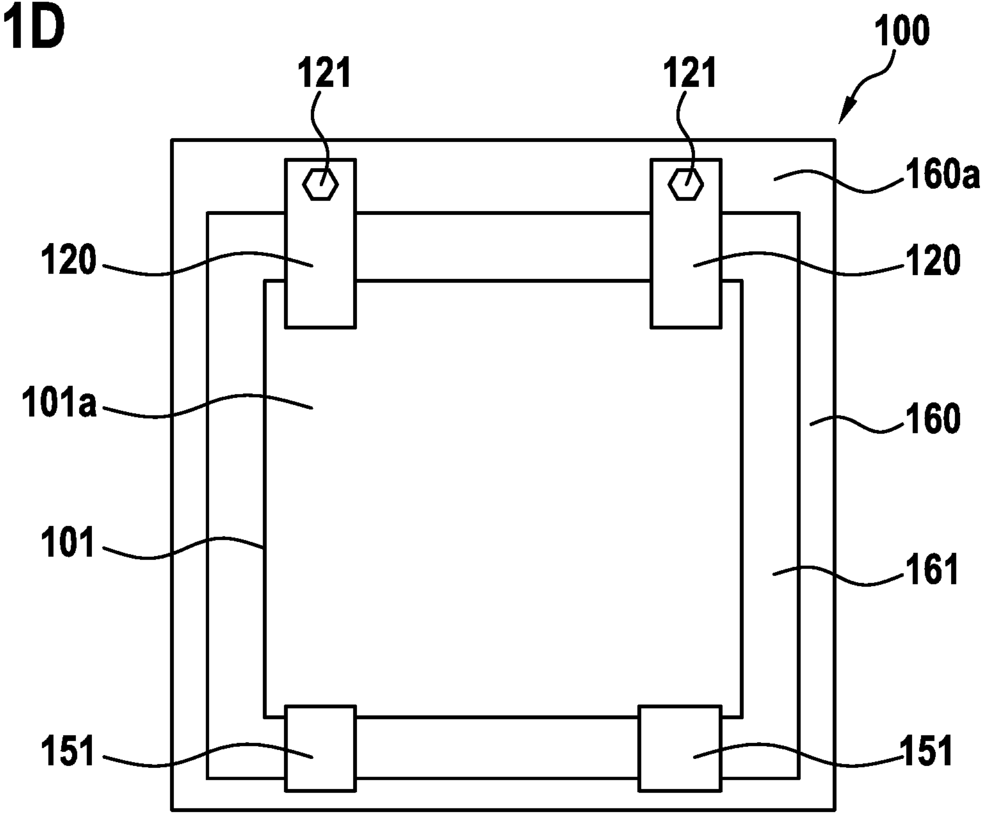

FIG. 1D shows another example of a substrate 101 attached to a carrier 100. According to some embodiments, which can be combined with other embodiments described herein, the carrier 100 includes positioning elements 151 for positioning the substrate 101 in the substrate area. The positioning elements 151 may be fixedly attached to the frame 160. One or more first positioning elements 151 may be provided.

For example, the positioning elements 151 may include guiding elements. According to some embodiments, the positioning elements are adapted to avoid free movement of the substrate 101 and/or are provided to hold more than 50% of the weight of the substrate in the substrate receiving surface of the support body.

The carrier 100 further includes at least two adhesive portions 120, e.g. on a top side or upper side of the frame 160. Moreover, the number of adhesive portions can be adapted according to the embodiments described herein. According to some embodiments, two or more adhesive portions 120 are provided. Particularly, two or more adhesive portions 120 can be provided on one or more sides of the substrate, as for instance shown in FIG. 1C.

Moreover, according to typical embodiments, one or more attaching elements 121 configured to attach the adhesive 120 to the carrier body 160 may be provided. As shown e.g. in FIG. 1D, according to typical embodiments the attaching elements 121 are configured to attach the adhesive 120 to the backside surface of the carrier body 160*a*. Typically, one or more attaching elements 121 can be provided to attach an adhesive 120 portion to the carrier body 160.

Although a support for supporting a substrate 101 is provided, wherein the support is a carrier as shown e.g. in FIG. 1A, the present disclosure is not limited thereto. A support for holding a substrate wherein the support is configured to hold the upper side of the substrate is also provided, as described e.g. in more details with respect to FIG. 2.

Figure 2:
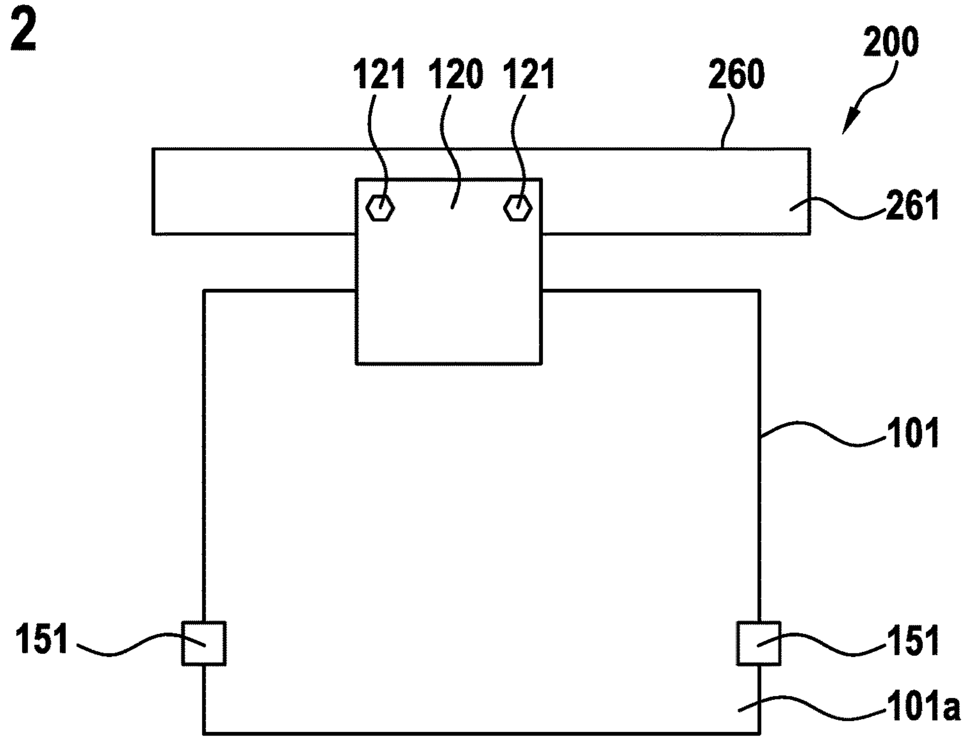
FIG. 2 shows another example of a support for holding a substrate according to embodiments described herein.

FIG. 2 shows another example of a backside view of a support attached to a substrate 101 according to some embodiments. The support 200 is configured for supporting a large area substrate with a narrow thickness. As shown in FIG. 2, the substrate 101 is provided in a position within the support 200, particularly when processed in a processing chamber. The support 200 typically includes a support body 260, wherein the support body 260 is configured to hold the upper side of the substrate.

Typically, the support body 260 is a bar. According to typical implementations, the support body 260 provides a substrate receiving surface 261. Typically, the substrate receiving surface 261 is configured to receive a perimeter portion of the upper side of the substrate during operation, i.e. when the substrate is loaded.

The support of FIG. 2 further includes an adhesive 120, wherein the adhesive is configured to attach the substrate to the support body 260. Typically, the adhesive is an adhesive tape as shown e.g. in FIG. 2.

In the example shown in FIG. 2, the support includes one adhesive 120 portion positioned at the middle of the support body. Although one adhesive 120 portion is shown at the support body in FIG. 2, the present disclosure is not limited thereto. More than one adhesive 120 portion could be provided at the support body 260. According to typical embodiments, which can be combined with other embodiments described herein, more than one adhesive 120 portion is provided and/or distributed along the length of the support body 260.

As shown in FIG. 2, the support 200 may further include positioning elements 151 for positioning the substrate 101 in the substrate area configured to provide for a predetermined substrate position. The positioning elements 151 may be fixedly attached to a chamber wall or chamber walls. According to some embodiments, which can be combined with other embodiments described herein, one or more positioning elements 151, which are fixedly attached to a chamber wall or chamber walls, are provided.

Typically, the positioning elements 151 are configured to attach the lower side of the substrate. According to some embodiments, which can be combined with other embodiments described herein, two position elements 151 are provided, as shown in FIG. 2. The positioning elements can have a gap for substrate insertion or other elements for arranging the substrate in the positioning element, wherein an edge contacting surface configured for contacting the edge of the substrate and defining a contact position is provided. The contact position defines the predetermined substrate position in the chamber.

Moreover, as shown in FIG. 2, the adhesive 120 is configured to contact a first surface of the substrate, wherein said first surface is the backside surface of the substrate 101*a*. A contact between the upper surface or deposition surface of the substrate and the support 200 is also reduced or even avoided. Hence, uniformity of a layer during a deposition process can also be improved.

As shown in FIG. 2, the support may further include one or more attaching elements 121 configured to attach the adhesive 120 to the support body 260. According to typical embodiments, the attaching elements 121 can be screws, rivets, clamps, or other elements to attach the adhesive 120 to the support body 260.

The adhesive 120 shown in FIG. 2 also provides an attachment of the substrate 101 to the support body 260 which avoids or reduces forces that push the substrate edge towards the substrate center. Hence, bulging of the substrate is also reduced.

Moreover, according to some embodiments, a distribution of the adhesive portions 120 and the positioning elements 151 over the substrate sides can be selected to improve a reduction of bulging of the substrate 101.

According to different embodiments, the supports and methods according to embodiments described herein can be utilized for PVD deposition processes, CVD deposition processes, substrate structuring edging, heating (e.g. annealing) or any kind of substrate processing. Embodiments of supports as described herein and methods for utilizing such supports are particularly useful for non-stationary, i.e. continuous substrate processing. Typically, the supports are provided for processing vertically oriented large area glass substrates.

Figure 3:
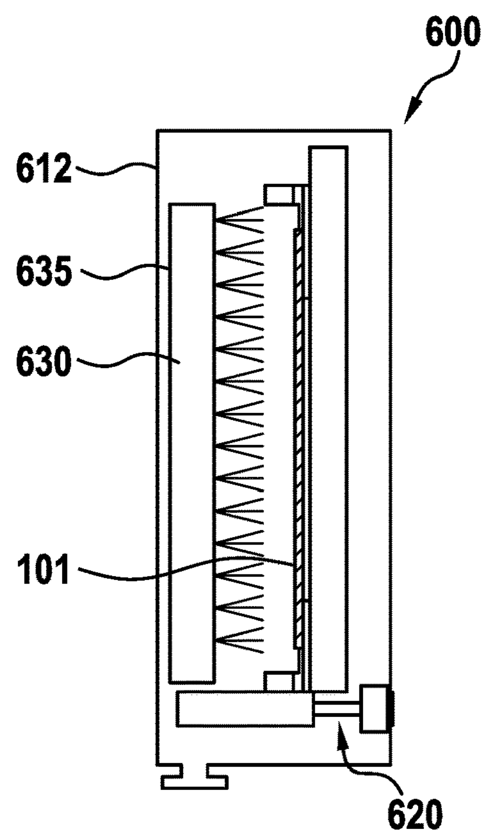
FIG. 3 shows a view of an apparatus for depositing a layer of material on a substrate utilizing a support according to embodiments described herein.

FIG. 3 shows a schematic view of a deposition chamber 600 according to embodiments. The deposition chamber 600 is adapted for a deposition process, such as a PVD or CVD process. A substrate 101 is shown being located within or at a support on a substrate transportation device 620. A deposition material source 630 is provided in chamber 612 facing the side of the substrate to be coated. The deposition material source 630 provides deposition material 635 to be deposited on the substrate. Typically, during a deposition process, the processing temperature in the chamber is about 500° C.

In FIG. 3, the source 630 may be a target with deposition material thereon or any other arrangement allowing material to be released for deposition on substrate 101. Typically, the material source 630 may be a rotatable target. According to some embodiments, the material source 630 may be movable in order to position and/or replace the source. According to other embodiments, the material source may be a planar target.

According to some embodiments, the deposition material 635 may be chosen according to the deposition process and the later application of the coated substrate. For instance, the deposition material of the source may be a material selected from the group consisting of: a metal, such as aluminum, molybdenum, titanium, copper, or the like, silicon, indium tin oxide, and other transparent conductive oxides. Typically, oxide-, nitride- or carbide-layers, which can include such materials, can be deposited by providing the material from the source or by reactive deposition, i.e. the material from the source reacts with elements like oxygen, nitride, or carbon from a processing gas.

A support according to embodiments described herein can be beneficial for stationary processes and also for non-stationary processes.

According to embodiments, which can be combined with other embodiments described herein, a fixation assembly firmly holds the edges of a substrate particularly during a deposition process. Embodiments can provide a decrease in substrate breakage, particularly in light of the fact that the substrates are getting bigger in length and height, and the thickness of the substrates decreases. The bulging, which might also affect the processing of the substrate, can be reduced by the carriers according to embodiments described herein.

While the foregoing is directed to embodiments of the present disclosure, other and further embodiments of the present disclosure may be devised without departing from the basic scope thereof, and the scope thereof is determined by the claims that follow.

The invention claimed is:

1. A method for holding and processing a substrate having a size of 1.4 $m^2$ or more, comprising:

attaching an adhesive to a support, wherein a material of the adhesive is a synthetic setae material, and wherein the adhesive is configured to attach the substrate to the support;

attaching the adhesive to a backside surface of the substrate;

securing the substrate in an aperture of the support using the adhesive, the aperture extending from a backside surface of the support and to a frontside surface of the support;

transporting the substrate in an essentially vertical orientation, the essentially vertical orientation including a deviation of up to 15 degrees from an exact vertical orientation; and processing a frontside surface of the substrate in the essentially vertical orientation in a process chamber.

2. The method according to claim 1, wherein the adhesive is attached to the backside surface of the substrate before being attached to the support.

3. The method according to claim 1, wherein the adhesive is attached to the support before being attached to the backside surface of the substrate.

4. The method according to claim 1, wherein a thickness of the substrate is 0.3 mm or less.

5. The method according to claim 1, wherein a first surface of the adhesive contacts the backside surface of the substrate and the support, the processing the frontside surface includes a vapor deposition process, and the process chamber is a vacuum chamber.

6. The method according to claim 1, wherein the adhesive is inorganic.

7. The method according to claim 1, wherein a microstructure of the adhesive comprises carbon nanotubes.

8. The method according to claim 1, wherein a storage elastic modulus G' of the adhesive is constant up to 600° C.

9. A support for holding a substrate and processing a frontside surface of the substrate in a process chamber, the support comprising: a support body comprising an aperture extending from a backside surface of the support body and to a frontside surface of the support body, and one or more adhesive tabs attached to the support body, wherein a material of the one or more adhesive tabs is a synthetic setae material and wherein the one or more adhesive tabs are configured to attach the support body to a backside surface of the substrate, secure the substrate in the aperture of the support body, and support the substrate in an essentially vertical orientation, the essentially vertical orientation including a deviation of up to 15 degrees from an exact vertical orientation, and the substrate having a size of 1.4 $m^2$ or more.

10. The support of claim 9, wherein the support body is a carrier body and wherein the carrier body comprises a frame having the aperture.

11. The support of claim 9, wherein the support body comprises a bar configured to hold an upper side of the substrate.

12. The support of claim 9, wherein the support further comprises at least a positioning element configured to fix a position of the substrate.

13. A substrate for use in a process chamber to process a frontside surface of the substrate, the substrate comprising an adhesive, wherein a material of the adhesive is a synthetic setae material and wherein the adhesive is configured to attach a backside surface of the substrate to a support to secure the substrate in an aperture of the support, the aperture extending from a backside surface of the support and to a frontside surface of the support, wherein the support is comprised in a transportation system configured to transport the substrate in an essentially vertical orientation, the essentially vertical orientation including a deviation of up to 15 degrees from an exact vertical orientation, and the substrate having a size of 1.4 $m^2$ or more.

14. The substrate of claim 13, wherein a thickness of the substrate is 0.3 mm or less, and wherein the substrate has a size of 2 $m^2$ to 9 $m^2$.

15. The substrate of claim 13, wherein a thickness of the substrate is 0.2 mm or less, and/or wherein the substrate has a size of 4 $m^2$ or more.

16. The method according to claim 1, wherein a thickness of the substrate is 0.2 mm or less, and/or wherein the substrate has a size of 4 $m^2$ or more.

17. The method according to claim 1, wherein a storage elastic modulus G' of the adhesive is constant up to 500° C., wherein the storage elastic modulus G' is 105 Pa.

18. The method according to claim 1, wherein the processing the frontside surface of the substrate comprises exposing an entirety of the frontside surface of the substrate to the processing.

19. The support of claim 9, wherein a first surface of each of the one or more adhesive tabs is configured to contact the support body and the backside surface of the substrate, the processing the frontside surface includes a vapor deposition process, and the process chamber is a vacuum chamber.

20. The substrate of claim 13, wherein a first surface of the adhesive is configured to contact the support and the backside surface of the substrate, the process includes a vapor deposition process, and the process chamber is a vacuum chamber.

21. The substrate of claim 13, wherein the support the support exposes an entirety of the frontside surface of the substrate to the process chamber.

* * * * *